(12) United States Patent
Chen et al.

(10) Patent No.: US 7,764,088 B2
(45) Date of Patent: Jul. 27, 2010

(54) FREQUENCY DETECTION CIRCUIT AND DETECTION METHOD FOR CLOCK DATA RECOVERY CIRCUIT

(75) Inventors: Kuan-Yu Chen, Hsinchu (TW);
Wen-Ching Hsiung, Hsinchu (TW);
Cheng-Tao Chang, Tainan County (TW); Chia-Liang Lai, Changhua County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/237,025

(22) Filed: Sep. 24, 2008

(65) Prior Publication Data

US 2010/0073045 A1    Mar. 25, 2010

(51) Int. Cl.
*H03D 13/00* (2006.01)
(52) U.S. Cl. ............... 327/47; 327/3; 327/8; 327/9; 327/12; 327/40; 327/43; 327/49; 327/147; 327/156; 331/11; 331/25; 331/1 A; 375/375
(58) Field of Classification Search ............... 327/2, 327/3, 5, 7–10, 12, 40–43, 47, 49, 141–163; 375/355, 373–376; 331/11, 12, 25, 1 A
See application file for complete search history.

(56) References Cited

U.S. PATENT DOCUMENTS

| | | | | |
|---|---|---|---|---|
| 6,147,530 A | * | 11/2000 | Nogawa | ............... 327/156 |
| 6,307,413 B1 | * | 10/2001 | Dalmia et al. | ............... 327/166 |
| 6,310,521 B1 | * | 10/2001 | Dalmia | ............... 331/11 |
| 6,347,128 B1 | * | 2/2002 | Ransijn | ............... 375/376 |
| 6,489,851 B1 | * | 12/2002 | Miyada et al. | ............... 331/11 |
| 6,496,555 B1 | * | 12/2002 | Soda | ............... 375/376 |
| 6,683,930 B1 | * | 1/2004 | Dalmia | ............... 375/376 |
| 7,251,573 B2 | * | 7/2007 | Sanduleanu et al. | ............... 702/79 |
| 2002/0051510 A1 | * | 5/2002 | Noguchi | ............... 375/376 |

* cited by examiner

*Primary Examiner*—Lincoln Donovan
*Assistant Examiner*—Patrick O'Neill
(74) *Attorney, Agent, or Firm*—Winston Hsu

(57) ABSTRACT

A frequency detection circuit and a detection method thereof suitable for a clock data recovery (CDR) circuit are provided. The frequency detection circuit includes a phase detector, a first delayer, a frequency detector, and a logic circuit. The phase detector samples a data signal according to a first clock signal provided by the CDR circuit and provides a phase instruction signal according to the sampling. The first delayer delays the first clock signal to obtain a second clock signal. The frequency detector samples the data signal according to the second clock signal and provides a frequency instruction signal according to the sampling. The logic circuit generates a clock instruction signal according to the phase instruction signal and the frequency instruction signal. The CDR circuit adjusts the frequency of the first clock signal according to the status of the clock instruction signal.

20 Claims, 17 Drawing Sheets

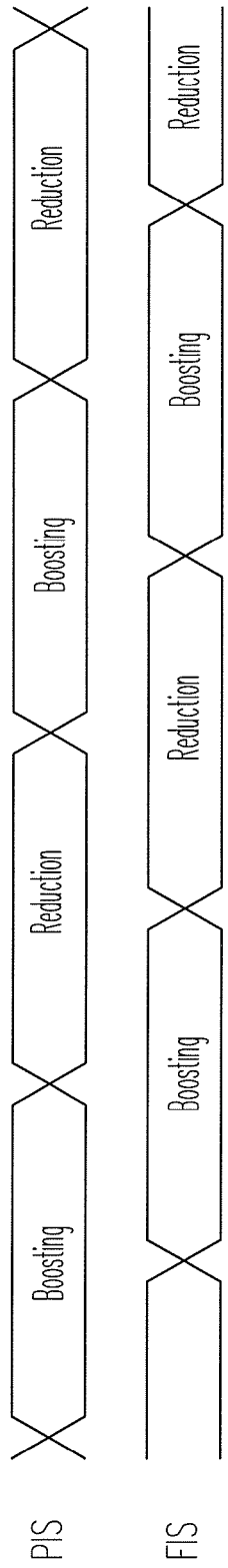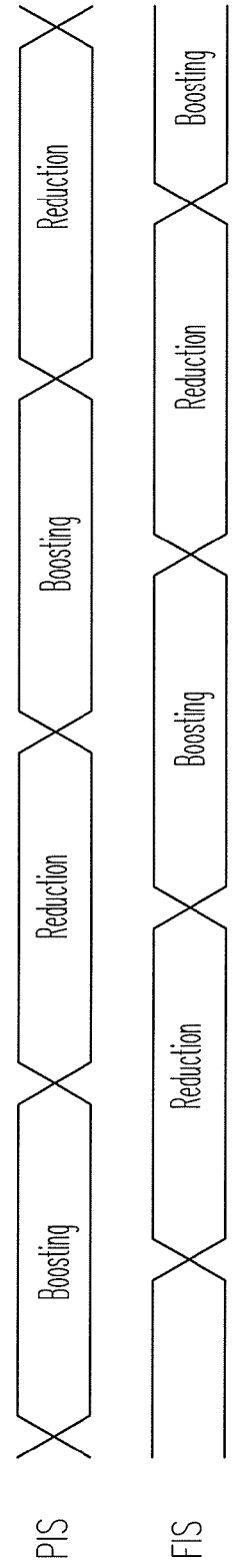
FIG. 4C (PRIOR ART)
FIG. 4D (PRIOR ART)

FREQUENCY DETECTION CIRCUIT AND DETECTION METHOD FOR CLOCK DATA RECOVERY CIRCUIT

BACKGROUND OF THE INVENTION

1. Field of the Invention

The present invention generally relates to a clock data recovery (CDR) circuit, and more particularly, to a frequency detection circuit and a detection method for a CDR circuit.

2. Description of Related Art

Generally, in order to correctly fetching data, a clock signal should be provided so as for being accorded to for sampling the data at a receiving terminal of a high speed serial data. The frequency and the phase of the clock signal must lock the received data signal. A conventional receiving terminal provides such a clock signal by a CDR circuit.

FIG. 1 is a schematic diagram of a conventional CDR circuit 100. Referring to FIG. 1, there is shown a voltage control oscillator (VCO) 103 providing a clock signal CLK. A phase detector 101 samples a data signal DS according to the clock signal CLK, and provides an instruction signal IS according to the sampling value. A charge pump 102 controls the VCO 103 to adjust a frequency of the clock signal CLK according to a status of the instruction signal IS.

FIGS. 2A through 2C schematically illustrate the operation of the phase detector 101. Referring to FIG. 2A, DS[0] through DS[3] represent four data transmitted by the data signal DS, in which there is a status change between each two data. The phase detector 101 consecutively samples the data signal DS according to the clock signal CLK, and provides the instruction signal IS according to a result of a comparison between the consecutive sampling values. As shown in FIG. 2A, if the sampling value 201 is equal to the sampling value 202, the two sampling values are all DS[1]. In this case, the phase detector 101 provides an instruction signal IS with a frequency reduction status, indicating that the frequency of the clock signal CLK is too high and should be reduced. If the sampling value 202 is equal to the sampling value 203, the two sampling values are all DS[2]. In this case, the phase detector 101 provides an instruction signal IS with a frequency boosting status, indicating that the frequency of the clock signal CLK is too low and should be boosted.

FIG. 2B illustrates a correlation of a status change time of the data signal DS with the status of the instruction signal IS, and the sampling time 202. If the clock signal CLK is too slow, the sampling time 202 is going to move rightwards, and therefore the instruction signal IS presents a frequency boosting status to accelerate the clock signal CLK, so as to have the sampling time 202 to move leftwards. Otherwise, if the clock signal CLK is too fast, the sampling time 202 is going to move leftwards, and therefore the instruction signal IS presents a frequency reduction status to decelerate the clock signal CLK, so as to have the sampling time 202 to move rightwards. In such a way, the sampling time 202 can be maintained at where the data signal DS changes status, i.e., a joint of two data, so as to guarantee the clock signal CLK to have a correct phase. FIG. 2C is another form of FIG. 2B.

The CDR circuit 100 is adapted for tracking the phase of the data signal DS, and is capable of tracking when there is a little difference between the frequencies of the data signal DS and the clock signal CLK. However, the CDR circuit 100 unfortunately can do nothing a large difference between the frequencies of the data signal DS and the clock signal CLK, which can be learnt by referring to FIG. 2B or 2C. In such a way, in order to prevent jitters, a conventional CDR circuit is usually featured of a very slight adjustment to the clock signal CLK, and thus incapable of tracking the frequency of the data signal DS which having a large difference.

In order to solve the problem, a dual-loop CDR circuit (also known as quadricorrelator) is proposed. FIG. 3 illustrates such a CDR circuit 300. The CDR circuit 300 includes a loop of a phase detector 301, and a charge pump 302 for phase detection, and a loop of a frequency detector 305 and a charge pump 306 for frequency detection. A VCO 303 provides two clock signals I_CLK and Q_CLK. A frequency of the clock signal I_CLK is same with that of the clock signal Q_CLK, while a phase of the clock signal Q_CLK falls $\pi/2$ behind a phase of the clock signal I_CLK. The phase detector 301 is functionally similar to the phase detector 101. Briefly, as shown in FIG. 4A, the phase detector 301 is adapted to sample the data signal DS according to the clock signal I_CLK, and provide a phase instruction signal PIS according to a result of the comparison between the consecutive sampling values. The charge pump 302 emits a control signal to the VCO 303, according to a status of the phase instruction signal PIS. The frequency detector 305 is functionally similar with the frequency detector 301. As shown in FIG. 4A, the frequency detector 305 is adapted to sample the data signal DS according to the clock signal Q_CLK, and provide a frequency instruction signal FIS according to a result of the comparison between the consecutive sampling values. The charge pump 306 emits a control signal to the VCO 303, according to a status of the frequency instruction signal FIS. An adder 304 is provided to add the control signals of the charge pumps 302 and 306, and output a final control signal to the VCO 303, for adjusting the frequencies of the clock signals I_CLK and Q_CLK.

FIG. 4B illustrates a correlation between the sampling times of the two clock signals and the statuses of the two instruction signals. As shown in FIG. 4B, when the frequencies of the clock signals I_CLK and Q_CLK are too fast, the phase instruction signal PIS changes its status prior to the frequency instruction signal FIS, as shown in FIG. 4C. On the contrary, when the frequencies of the clock signals I_CLK and Q_CLK are too slow, the frequency instruction signal FIS changes its status prior to the phase instruction signal PIS, as shown in FIG. 4D. When dividing a circle composed by the statuses of the two instruction signals into four quadrants, a diagram as shown in FIG. 4E can be obtained. As shown in FIG. 4E, when the frequencies of the clock signals I_CLK and Q_CLK are too fast, the diagram moves anticlockwise, and when the frequencies of the clock signals I_CLK and Q_CLK are too slow, the diagram moves clockwise. Such four quadrants not only enable the CDR circuit 300 to track the phase of the data signal DS, but also enable the CDR circuit 300 to track the frequency of the data signal DS.

In order to solve the conflict of the two instruction signals which present opposite statuses, the charge pump 306 must provide an adjustment very much more than an adjustment provided by the charge pump 302. However, it is hard for the CDR circuit 300 to determine the difference between the adjustments of the two charge pumps. If the difference is too small, a tracking speed will be affected, while if the difference is too large, the system may be caused unstable. As such, a suitable adjustment difference can be determined only upon the analysis to any possible data pattern and the frequency of changing status.

SUMMARY OF THE INVENTION

Accordingly, the present invention is directed to a detection circuit and a detection method for a CDR circuit, for tracking a phase difference and a frequency difference between a data signal and a clock signal at a receiving terminal. The CDR circuit demands only a single loop, and thus has no disadvantages of conventional dual-loop CDR circuits.

The present invention provides a frequency detection circuit, for a CDR circuit. The frequency detection circuit includes a phase detector, a first delayer, a frequency detector, and a logic circuit. The phase detector is adapted for sampling a data signal according to a first clock signal provided by the CDR circuit and obtaining a first group of sampling values, and providing a phase instruction signal according to the first group of sampling values. The first delayer is adapted for delaying the first clock signal so as to obtain a second clock signal. The frequency detector is coupled to the first delayer, and is adapted for sampling the data signal according to the second clock signal and obtaining a second group of sampling values thereby, and providing a frequency instruction signal according to the second group of sampling values. The logic circuit is coupled to the phase detector and the frequency detector and the phase detector, and is adapted to execute a logic computation with the phase instruction signal and the frequency instruction signal, and therefore generate a clock instruction signal. The CDR circuit is adapted to adjust a frequency of the first clock signal according to a status of the clock instruction signal.

According to an embodiment of the present invention, a delaying time of the first delayer is a ¼ period of the first clock signal, and the frequency detection circuit further includes a second delayer. The second delayer is coupled between the frequency detector and the logic circuit, for delaying the frequency instruction signal. A delaying time of the second delayer is not equal to any integral multiple of the ¼ period of the first clock signal.

According to another embodiment of the present invention, a delaying time of the first delayer is not equal to any integral multiple of the ¼ period of the first clock signal, and the frequency detection circuit includes only one delayer.

The present invention also provides a detection method for a CDR circuit includes the steps of: sampling a data signal according to a first clock signal and obtaining a first group of sampling values, and providing a phase instruction signal according to the first group of sampling values; delaying the first clock signal to obtain a second clock signal; sampling the data signal according to the second clock signal and obtaining a second group of sampling values, and providing a frequency instruction signal according to the second group of sampling values; executing a logic computation with the phase instruction signal and the frequency instruction signal, and therefore generating a clock instruction signal; and adjusting a frequency of the first clock signal according to a status of the clock instruction signal.

There is a special phase difference between two clock signals of the present invention, and therefore the balance between the four quadrants is affected thereby. These unbalanced quadrants enable the CDR circuit with more capabilities for frequency tracking. The present invention is designed with a single loop, and provides a logic circuit in solving the conflict between the statuses of the two instruction signals. In such a way, the present invention has no difficulties usually involved by the conventional dual-loop CDR circuits, as well as the difficulty of determining the difference between the adjustments of the two charge pumps in accordance with the conventional technologies.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4A through 4E are schematic diagrams illustrating the operation of the CDR circuit of FIG. 3.

DESCRIPTION OF THE EMBODIMENTS

Figure 1:
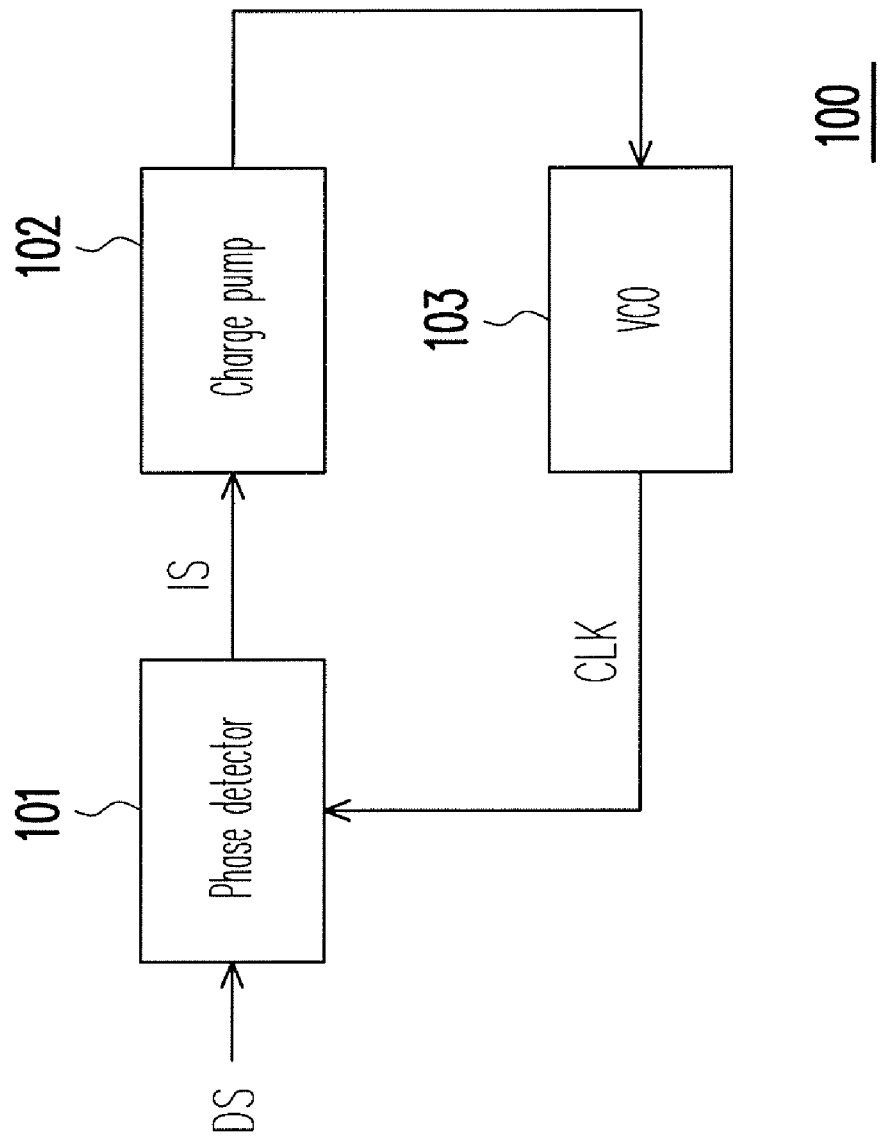
FIG. 1 is a schematic diagram of a conventional CDR circuit.
Figure 2A:
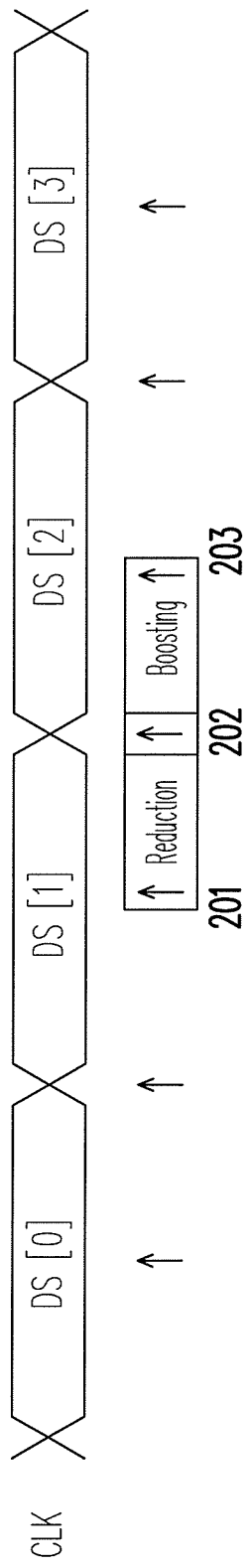
FIGS. 2A through 2C illustrate the operation of the conventional CDR circuit of FIG. 1.
Figure 2B:
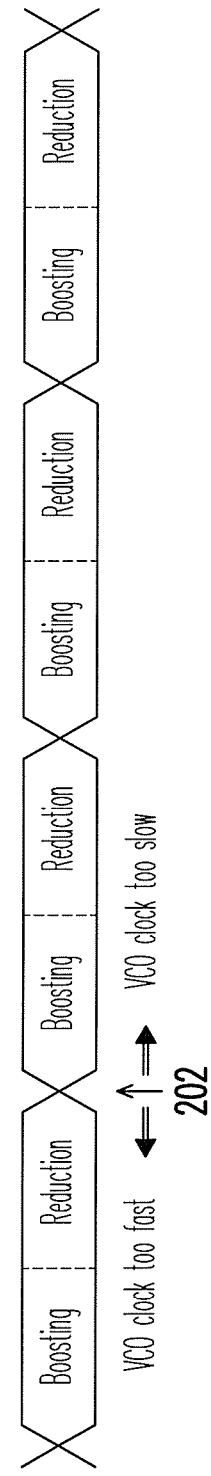
Figure 2C:
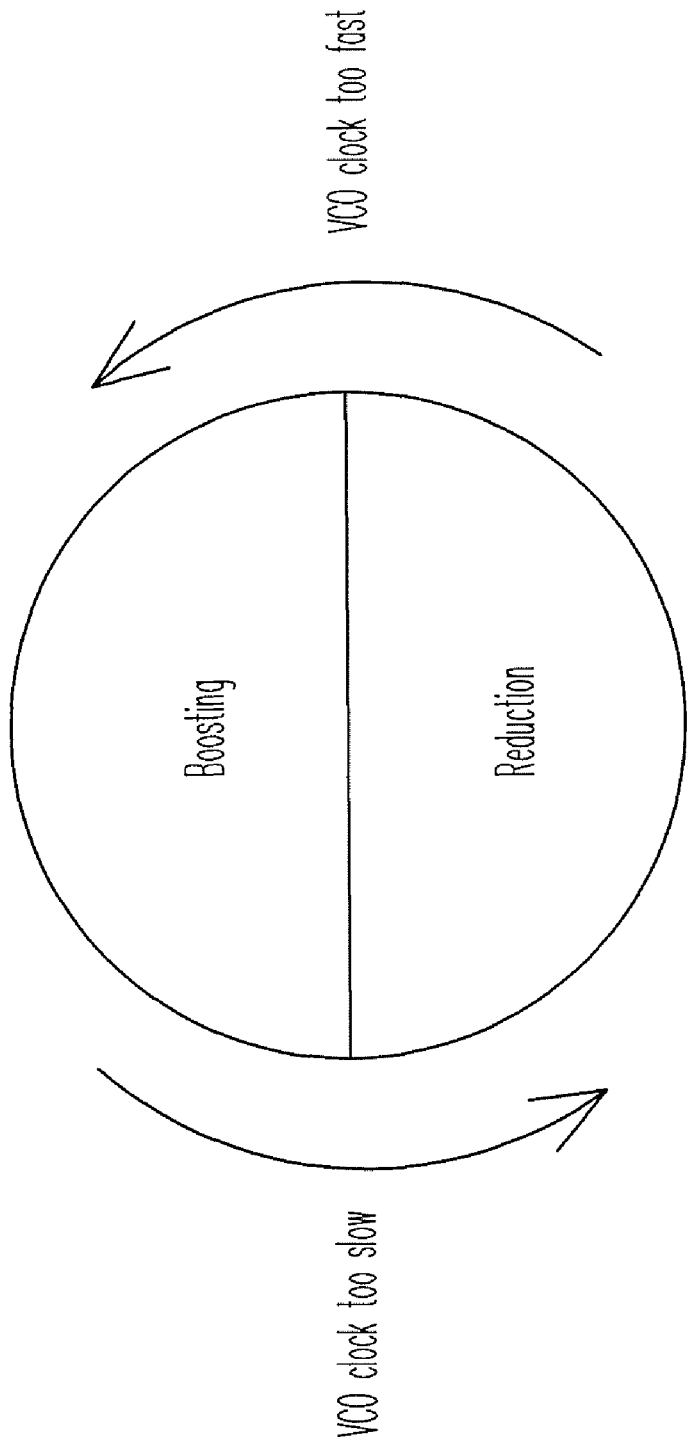
Figure 3:
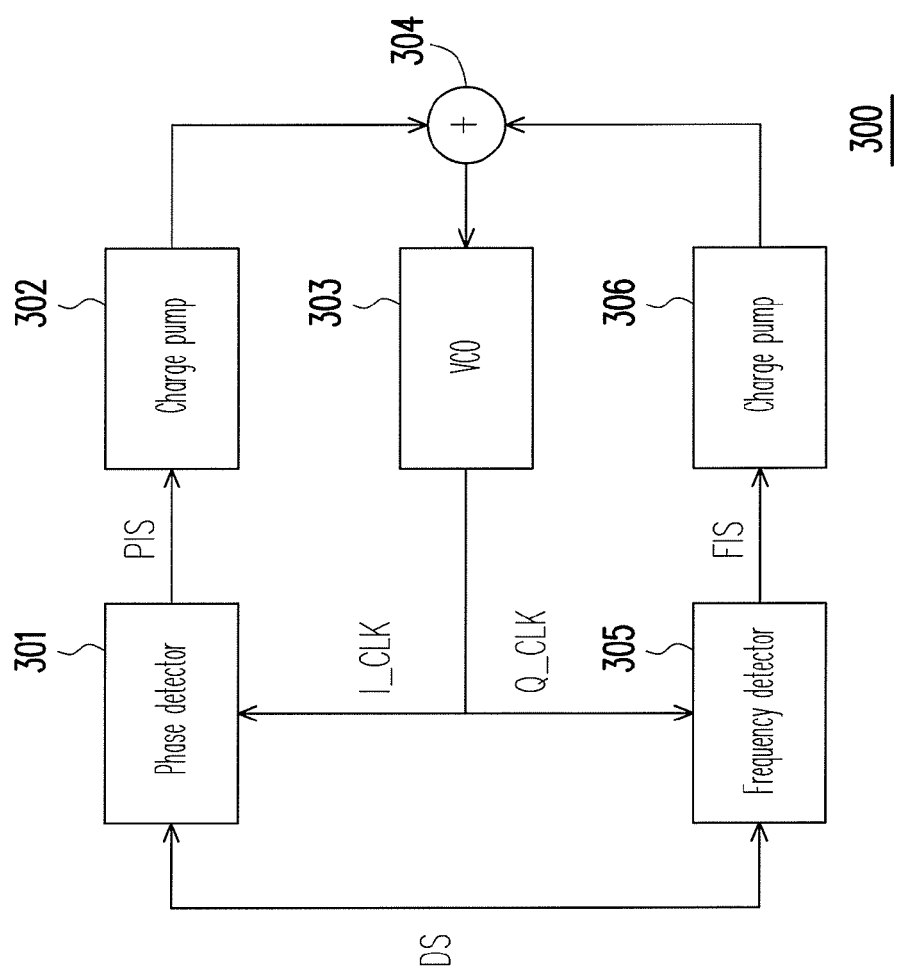
FIG. 3 is a schematic diagram illustrating another conventional CDR circuit having a quadricorrelator.
Figure 4A:
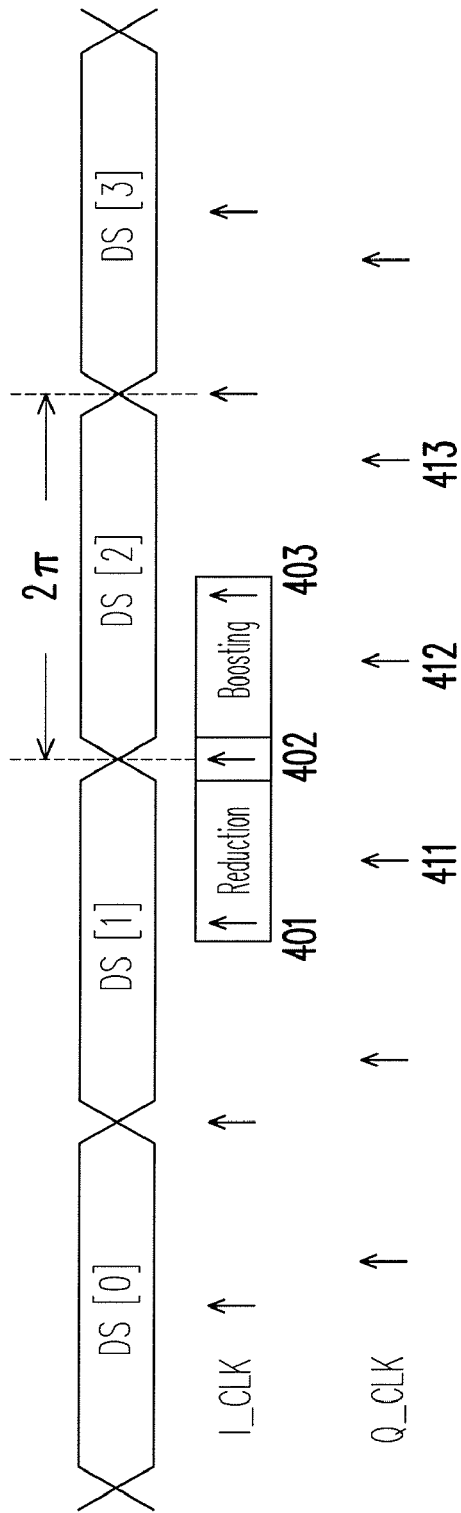
Figure 4B:
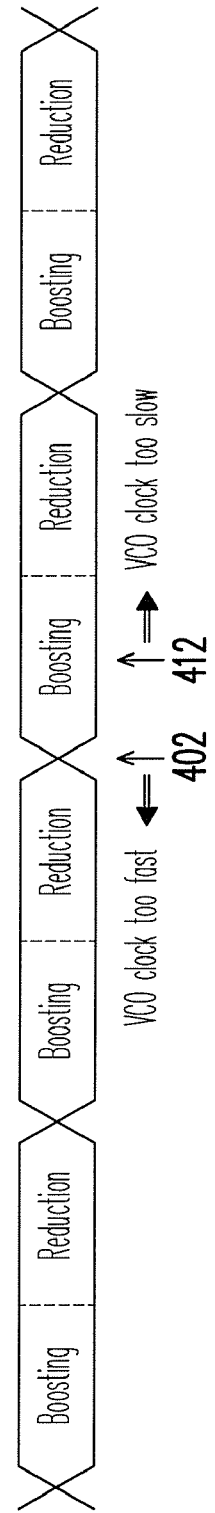
Figure 4E:
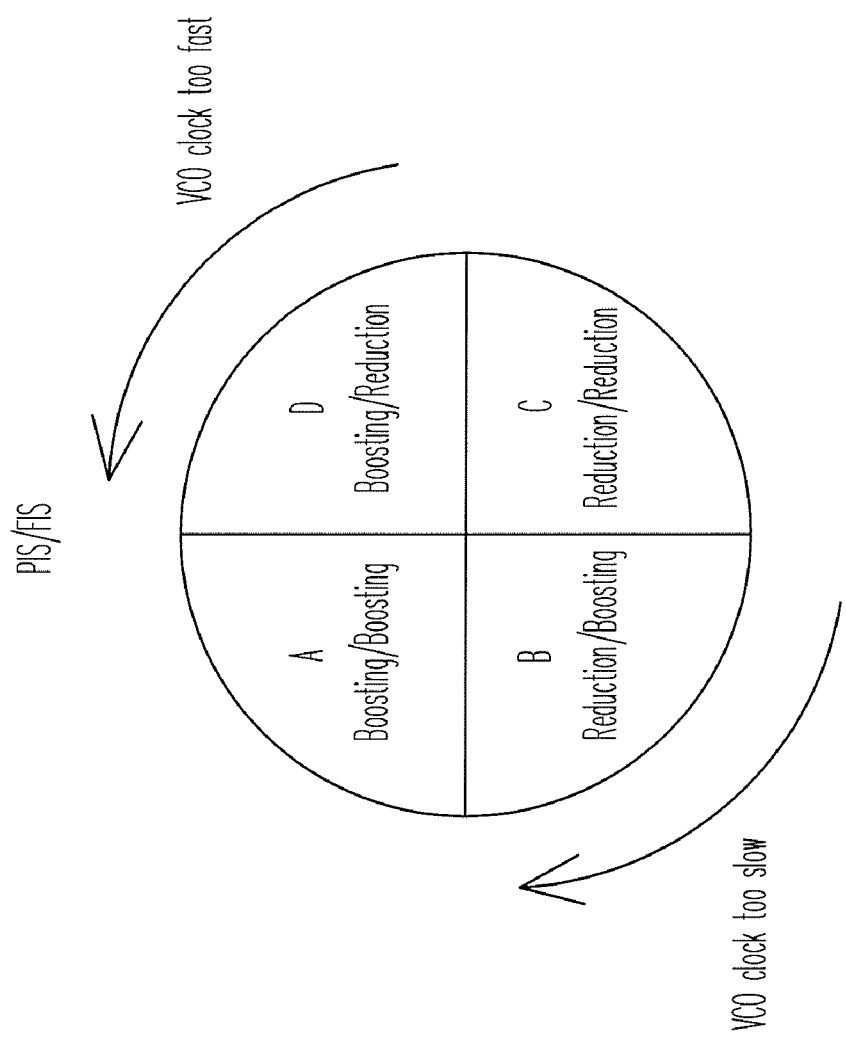

Reference will now be made in detail to the present preferred embodiments of the invention, examples of which are illustrated in the accompanying drawings. Wherever possible, the same reference numbers are used in the drawings and the description to refer to the same or like parts.

Figure 5:
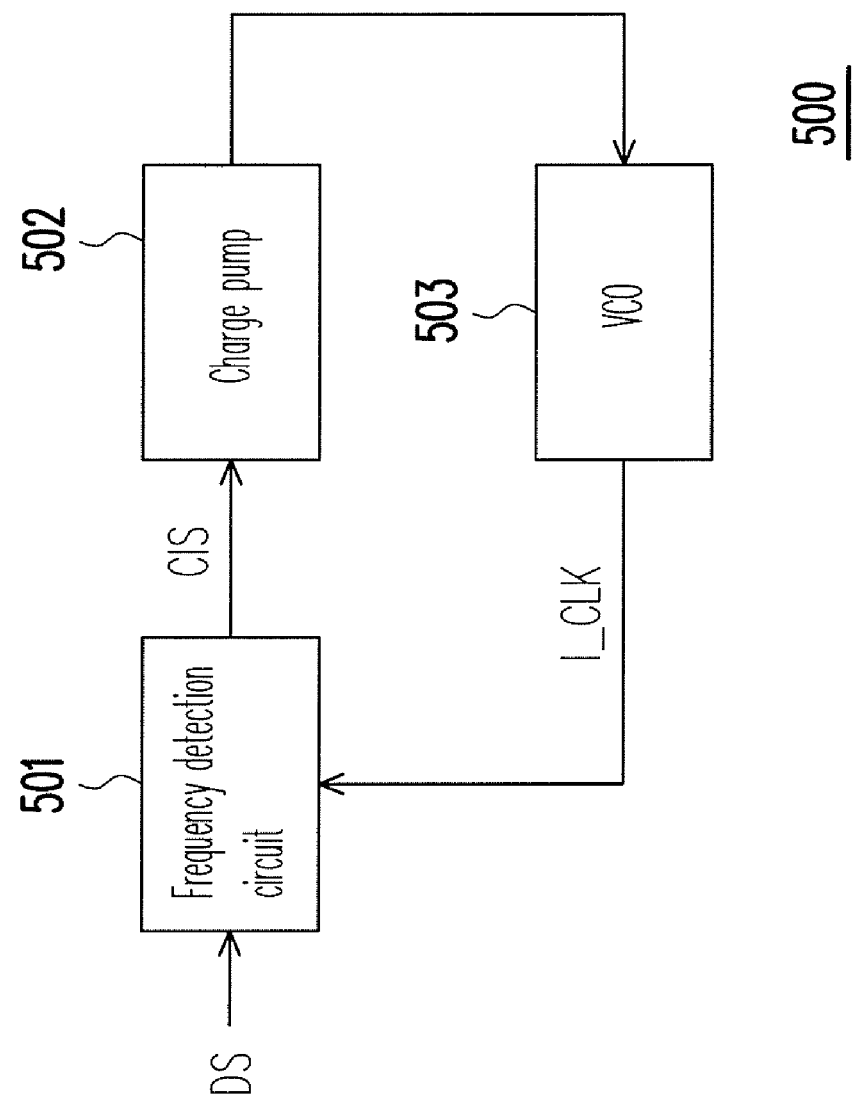
FIG. 5 is a schematic diagram illustrating a CDR circuit according to an embodiment of the present invention.

FIG. 5 is a schematic diagram illustrating a CDR circuit according to an embodiment of the present invention. As shown in FIG. 5, the CDR circuit 500 is designed with a single loop, rather than the dual-loop employed by the conventional CDR circuit 300. The CDR circuit 500 includes a frequency detection circuit 501, a charge pump 502, and a voltage control oscillator (VCO) 503, which are coupled in sequence configuring a ring form. The VCO 503 provides a clock signal I_CLK. The frequency detection circuit 502 samples a data signal DS according to the clock signal I_CLK, so as to detect a phase and a frequency of the data signal DS. As such, after executing a logic computation, the frequency detection circuit 501 generates a clock instruction signal CIS.

The charge pump 502 adjusts a frequency of the clock signal I_CLK by controlling the VCO 503 according to a status of the clock instruction signal CIS. When the clock instruction signal CIS presents a frequency boosting status, the charge pump 502 boosts the frequency of the clock signal I_CLK; or otherwise when the clock instruction signal CIS presents a frequency reduction status, the charge pump 502 reduces the frequency of the clock signal I_CLK; or when the clock instruction signal CIS presents a frequency maintaining status, the charge pump 502 maintains the frequency of the clock signal I_CLK unchanged. The aforementioned statuses are to be illustrated in more details herebelow.

Figure 6:
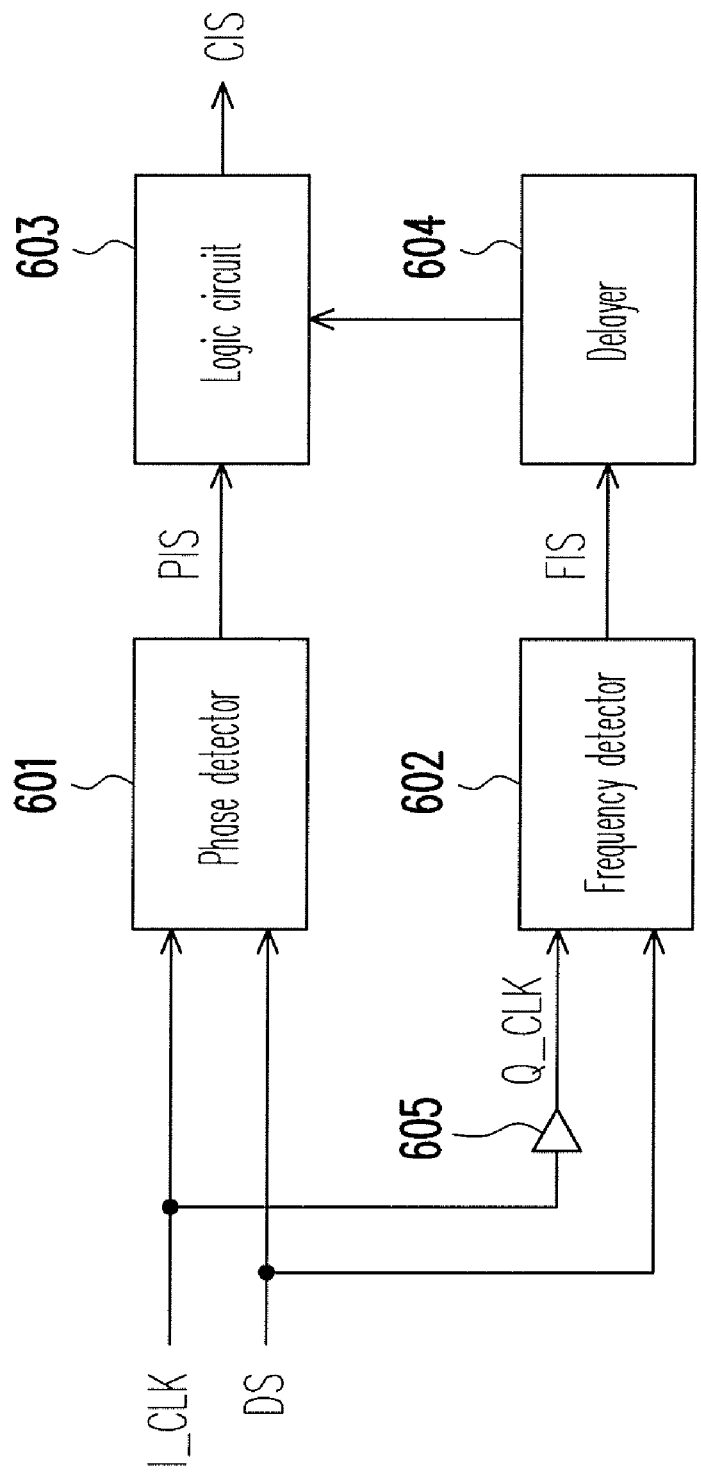
FIG. 6 is structural schematic diagram illustrating a frequency detection circuit of FIG. 5.

FIG. 6 is structural schematic diagram illustrating the frequency detection circuit 501. Referring to FIG. 6, the frequency detection circuit 501 includes a phase detector 601, a delayer 605, a frequency detector 602, a delayer 604, and a logic circuit 603.

The phase detector 601 is similar to the conventional phase detector 301, and is provided for consecutively sampling the data signal DS according to the clock signal I_CLK, and obtaining consecutive sampling values thereby, so as to provide a phase instruction signal PIS presenting with a frequency boosting status or a frequency reduction status according to a result of a comparison between the consecutive sampling values.

The delayer 605 delays the clock signal I_CLK to obtain another clock signal Q_CLK. The frequency detector 602 is coupled to the delayer 605. The frequency detector 602 is similar to the conventional frequency detector 305, and is provided for consecutively sampling the data signal DS according to the clock signal Q_CLK, and obtaining consecutive sampling values thereby, so as to provide a frequency instruction signal FIS presenting with a frequency boosting status or a frequency reduction status according to a result of a comparison between the consecutive sampling values.

The delayer 604 is coupled to the frequency detector 602, for delaying the frequency instruction signal FIS. The logic circuit 603 is coupled to the phase detector 601 and the delayer 604. The logic circuit 603 executes a logic computation with the phase instruction signal PIS and the delayed frequency instruction signal FIS so as to generate the clock instruction signal CIS.

Figure 7A:
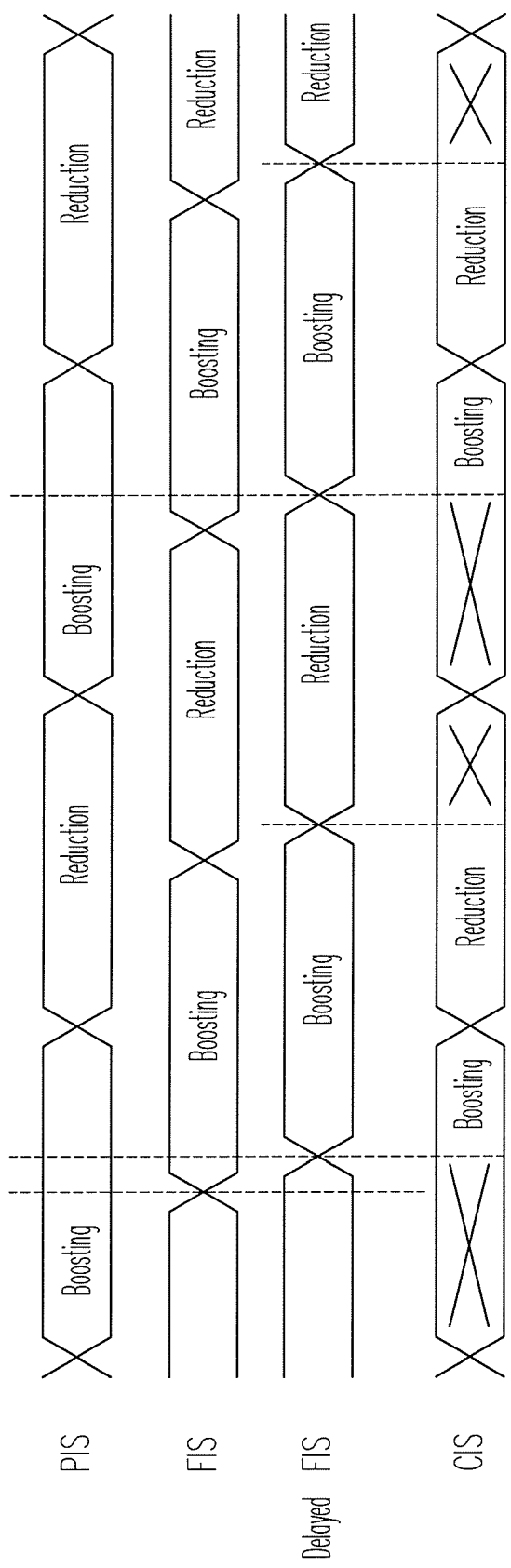
FIGS. 7A through 7D illustrate the operation of the frequency detection circuit of FIG. 6.

The delayer 605 delays the clock signal I_CLK for a ¼ period. In other words, the phase of the clock signal Q_CLK is delayed for $\pi/2$. A delaying time of the delayer 604 is not equal to any integral multiple of the ¼ period of the clock signal I_CLK. In such a way, a total delaying time of the delayers 604 and 605 is not equal to the ¼ period of the clock signal I_CLK, or any integral multiple of the ¼ period of the clock signal I_CLK. FIGS. 7A through 7D illustrate the operation of the frequency detection circuit of FIG. 6. As shown in FIG. 7A, when the clock signals I_CLK and Q_CLK are too fast, the phase instruction signal PIS changes its status first, and then the frequency instruction signal FIS changes its status, and finally the frequency instruction signal FIS which is delayed by the delayer 604 changes its status.

FIG. 7A also illustrates how the status of the clock instruction signal CIS is determined by the phase instruction signal PIS and the frequency instruction signal FIS. The logic circuit 603 is governed by the following rules, in which the frequency instruction signal FIS specified herebelow is the frequency instruction signal FIS after being delayed, i.e., the frequency instruction signal FIS practically received by the logic circuit 603. If both of the phase instruction signal PIS and the frequency instruction signal FIS present a frequency boosting status, the logic circuit 603 makes the clock instruction signal CIS to present a frequency boosting status. If the phase instruction signal PIS presents a frequency reduction status while the frequency instruction signal FIS presents a frequency boosting status, the logic circuit 603 makes the clock instruction signal CIS to present a frequency reduction status. If the frequency instruction signal FIS presents a frequency reduction status, despite the status of the phase instruction signal PIS, the logic circuit 603 makes the clock instruction signal CIS to present a maintaining status. Cross marks are used in FIG. 7 in representing the maintaining status. It can be learnt from FIG. 7, the clock instruction signals CIS presents more frequency reduction status than frequency boosting status. In such a way, the VCO 503 is adapted to reduce the frequencies of the clocks signals I_CLK and Q_CLK, so as to achieve the object of tracking the data signal DS.

Figure 7B:
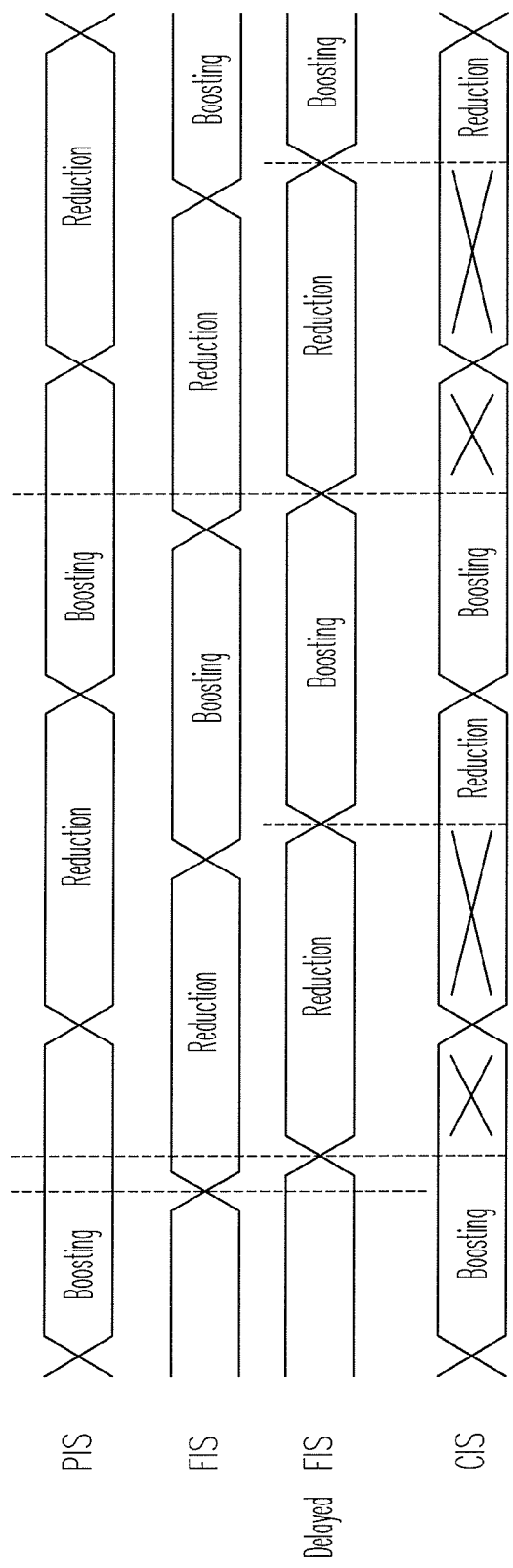

However, when the clock signals I_CLK and Q_CLK are too slow, as shown in FIG. 7B, the frequency instruction signal FIS which is delayed by the delayer 604 changes its status first, and then the phase instruction signal PIS changes its status. The clock instruction signals CIS presents more frequency boosting status than frequency reduction status, and in such a way, the VCO 503 is adapted to boost the frequencies of the clocks signals I_CLK and Q_CLK, so as to achieve the object of tracking the data signal DS.

Figure 7C:
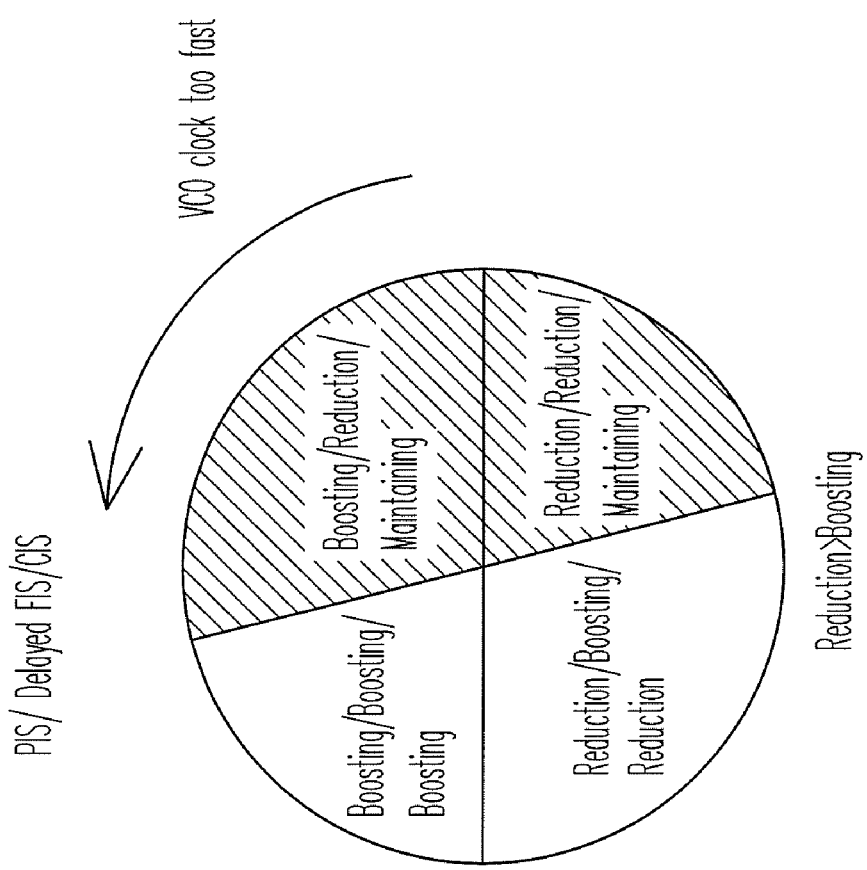
Figure 7D:
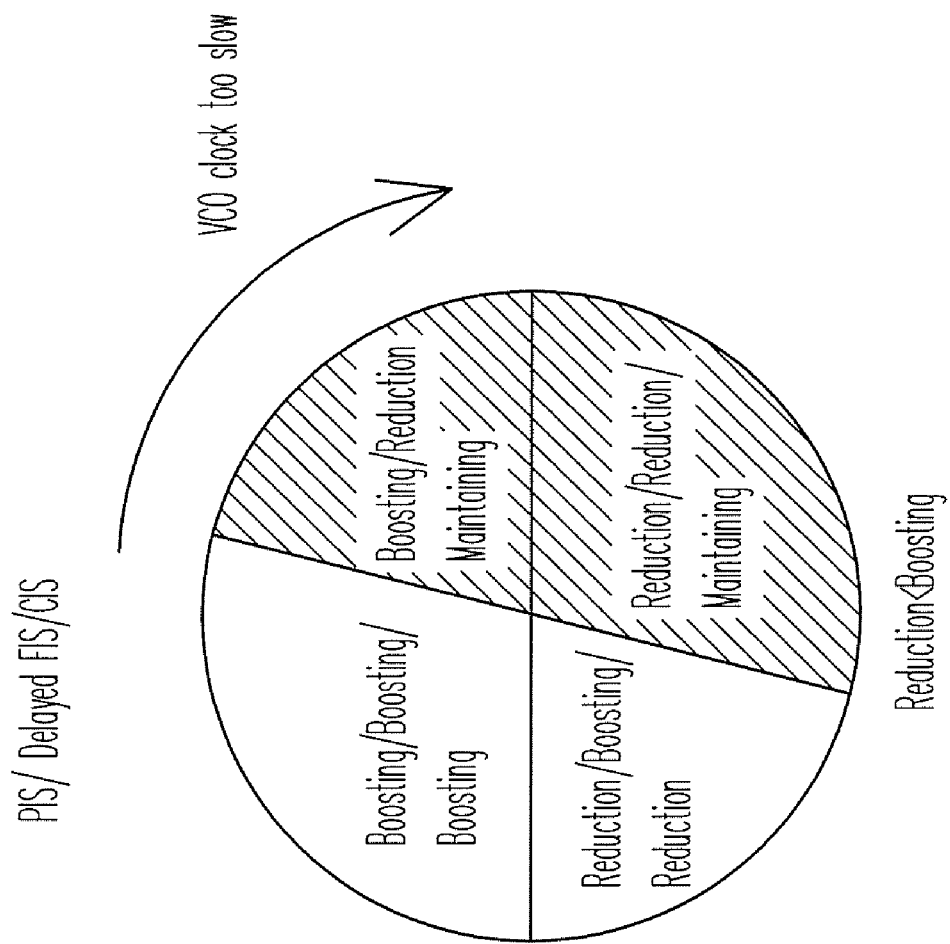

When representing the phase difference between the clock signal I_CLK of the VCO 503 and the data signal DS with a circle, and dividing quadrants by the statuses of the phase instruction signal PIS and the delayed frequency instruction signal FIS, respectively, FIGS. 7C and 7D are obtained. FIG. 7C illustrates the situation when the frequency of the clock signal I_CLK is too high, and FIG. 7D illustrates the situation when the frequency of the clock signal I_CLK is too low. The current embodiment is featured in that it employs the delayers 604 and 605 to make the phase difference between the delayed frequency instruction signal FIS and the phase instruction signal PIS not equal to any integral multiple of $\pi/2$, and thus destroying a balance of the four quadrants. When the clock signal I_CLK is too fast, the clock instruction signal CIS presents a frequency reduction status, or otherwise when the clock signal I_CLK is too slow, the clock instruction signal CIS presents a frequency boosting status. As shown in FIGS. 7C and 7D, no matter the clock signal I_CLK is too fast or too slow, quadrants in which the clock instruction signal presents a correct status will always be greater than quadrants in which the clock instruction signal presents an erroneous status. In other words, the clock signal I_CLK has more probability to be correctly adjusted. As such, the CDR circuit 500 of the present embodiment is not only capable of tracking the phase of the data signal DS, but also capable of tracking and locking the frequency of the data signal DS.

Figure 8:
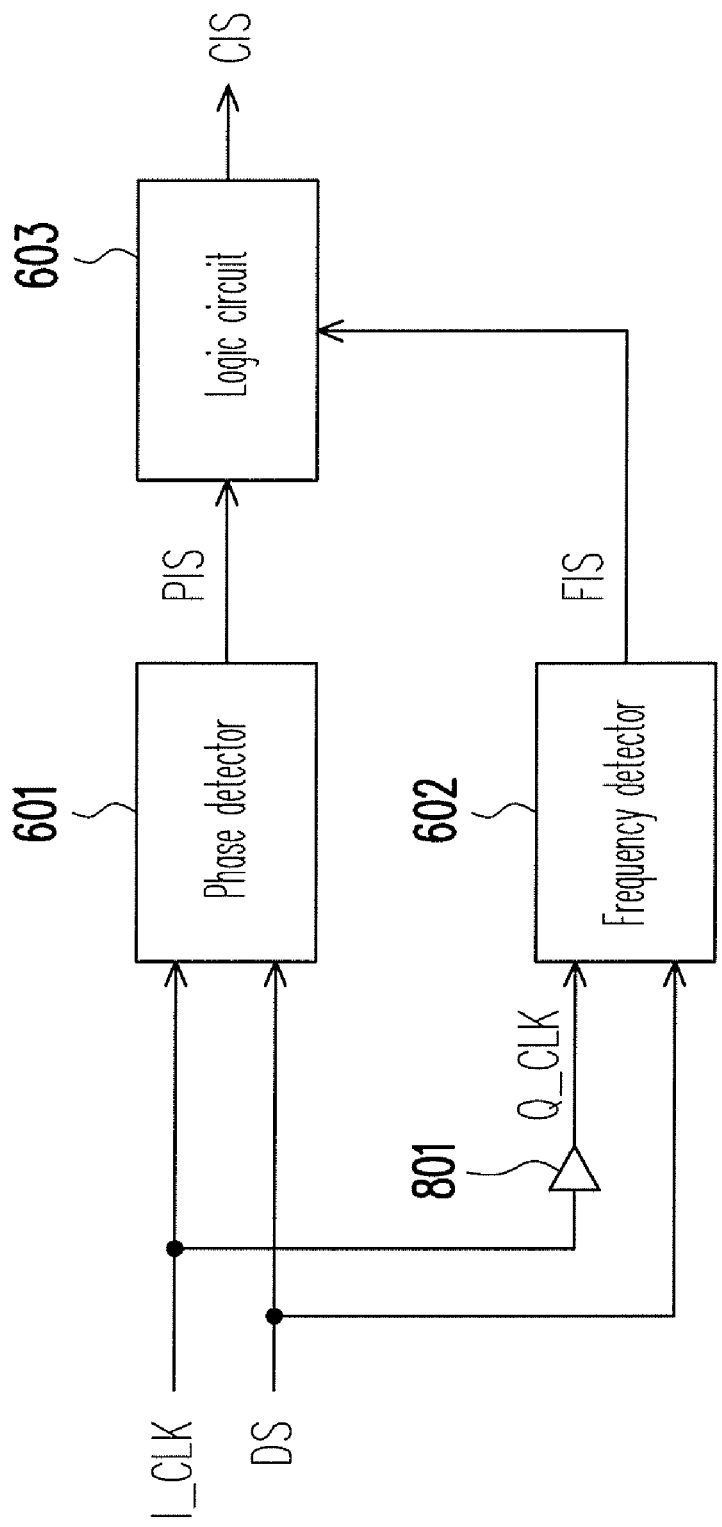
FIG. 8 is another structural schematic diagram illustrating the frequency detection circuit of FIG. 5.
Figure 9A:
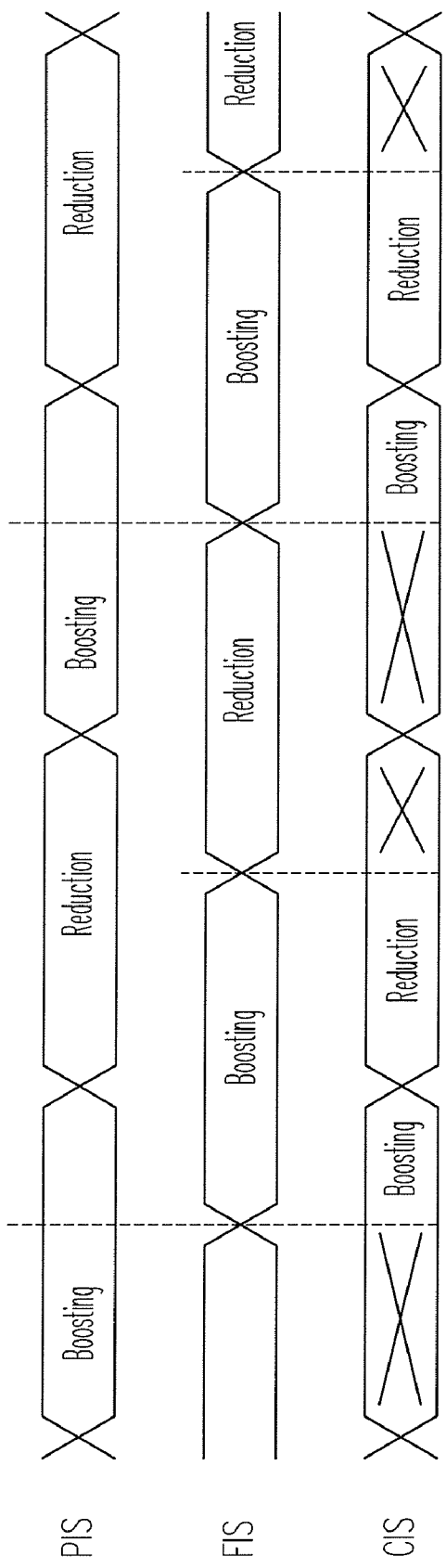
FIGS. 9A and 9B illustrate the operation of the frequency detection circuit of FIG. 8.
Figure 9B:
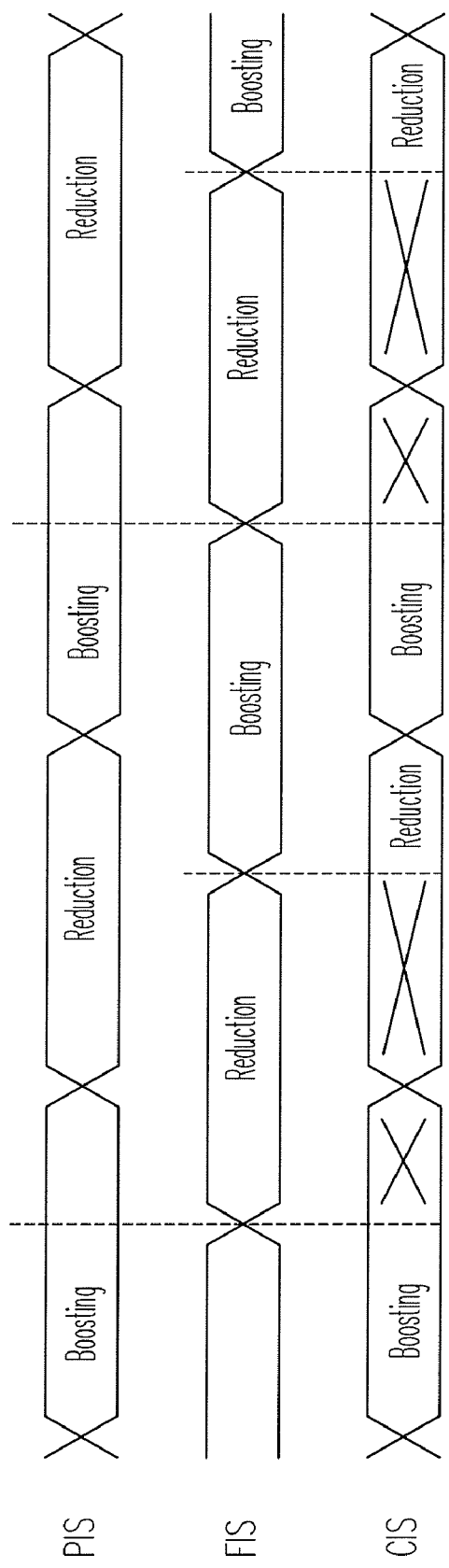

FIG. 8 is another structural schematic diagram illustrating the frequency detection circuit of FIG. 5. FIG. 8 differs from FIG. 6 as substituting a delayer 801 for the delayers 604 and 605. A delaying time of the delayer 801 is equal to a sum of the delay times of the delayers 604 and 605. As such, in the present embodiment, the phase difference between the clock signals Q_CLK and I_CLK is not an integral multiple of $\pi/2$, for example $2\pi/3$. When the clock signal I_CLK is too fast, the statuses of the phase instruction signal PIS, the frequency instruction signal FIS, and the clock instruction signal CIS are as shown in FIG. 9A, while correspondingly when the clock signal I_CLK is too slow, the frequency instruction signal FIS, and the clock instruction signal CIS are as shown in FIG. 9B. Comparing FIGS. 7A, 7B, and FIGS. 9A, B, it can be learnt that no matter the clock signal I_CLK is too fast or too slow, the present embodiment provides an equivalent clock instruction CIS as the previous embodiment. In other words, these two embodiments have equivalent capabilities in tracking and locking signals.

The phase detector 601 and the frequency detector 602 as shown in FIGS. 6 and 8 are well known by those skilled in the art and are not to be iterated hereby. The delayers 604, 605, and 801 can employ a plurality of serially connected inverters to delay the clock signals I_CLK or the frequency instruction signal FIS, to achieve the desired phase difference. As to the logic circuit 603, it can be realized as shown in FIG. 10.

Figure 10:
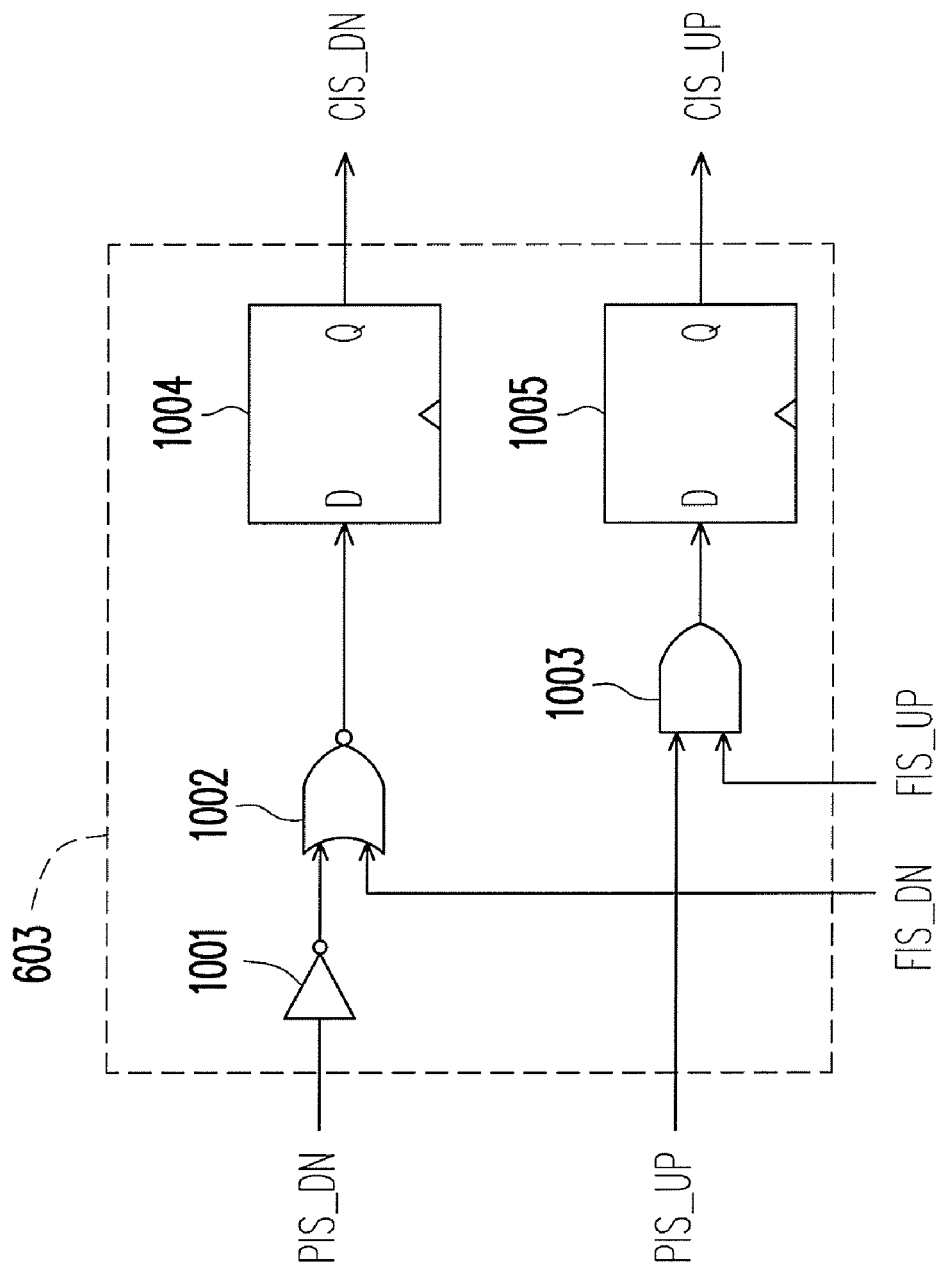
FIG. 10 is a structural diagram illustrating a logic circuit of FIG. 6.

FIG. 10 is a structural diagram illustrating a logic circuit of FIG. 6. Referring to FIG. 10, the phase instruction signal PIS includes a frequency boosting signal PIS_UP and a frequency reduction signal PIS_DN, and the frequency instruction signal FIS includes a frequency boosting signal FIS_UP and a frequency reduction signal FIS_DN, and the clock instruction signal CIS includes a frequency boosting signal CIS_UP and a frequency reduction signal CIS_DN. Regarding to each of the foregoing instruction signals, when the frequency boosting signal is asserted while the frequency reduction signal is de-asserted, the instruction signal presents a frequency boosting status; when the frequency boosting signal is de-asserted while the frequency reduction signal is asserted, the instruction signal presents a frequency reduction status; and when the frequency boosting signal and the frequency reduction signal are both de-asserted, the instruction signal presents a frequency maintaining status. In the present embodiment, logic 0 is used for representing assertion and logic 1 is used for representing de-assertion.

The logic circuit 603 of FIG. 10 includes an inverter 1001, a NOR gate 1002, an AND gate 1003, and D flip-fops 1004, 1005. The inverter 1001 is coupled to the phase detector 601, for receiving the frequency reduction signal PIS_DN of the phase instruction signal. The NOR gate 1002 is coupled to the inverter 1001 and the frequency detector 602, for receiving an output signal from the inverter 1001 and the frequency reduction signal FIS_DN of the frequency instruction signal, and outputting the frequency reduction signal CIS_DN of the clock instruction signal. The AND gate 1003 is coupled to the phase detector 601 and the frequency detector 602, for receiving the frequency boosting signal PIS_UP of the phase instruction signal and the frequency boosting signal FIS_UP of the frequency instruction signal, and outputting the frequency boosting signal CIS_UP of the clock instruction signal. The D flip-flops 1004 and 1005 are provided for compensating the unsymmetry of paths where generate the frequency boosting signal CIS_UP of the clock instruction signal and the frequency reduction signal CIS_DN of the clock instruction signal, and making the clock instruction signal CIS to get synchronous with the clock at the receiving terminal. The D flip-flop 1004 is coupled to the NOR gate 1002, and is adapted to be triggered by the clock signal I_CLK for delaying the frequency reduction signal CIS_DN of the clock instruction signal. The D flip-flop 1005 is coupled to the AND gate 1003, and is adapted to be triggered by the clock signal I_CLK for delaying the frequency boosting signal CIS_UP of the clock instruction signal.

It should be noted that the present invention concerns mainly on the principle of producing the clock instruction signal CIS. As such, any structure capable of producing the clock instruction signal as discussed in the embodiments should be considered as within the scope of the present invention, while the logic circuit 603 is not restricted to be as shown in FIG. 10.

Except the frequency detection circuit of the CDR circuit, the present invention further provides a corresponding detection method for the CDR circuit. The detection method is carried out by the frequency detection circuit as well as the CDR circuit as discussed above, and can be learnt by associated the discussion, and is not to be iterated hereby.

In summary, there is a special phase difference between two clock signals of the present invention, and therefore the balance between the four quadrants is affected thereby. These unbalanced quadrants enable the CDR circuit with not only more capabilities for tracking phase, but also more capabilities for locking frequency. The present invention is designed with a single loop, and provides a simple logic circuit in solving the conflict between the statuses of the two instruction signals. In such a way, the present invention has no difficulties usually involved by the conventional dual-loop CDR circuits, as well as the difficulty of determining the difference between the adjustments of the two charge pumps in accordance with the conventional technologies. As such, the present invention is adapted to save the circuit for the secondary loop, for example can save the second charge pump.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency detection circuit, for a clock data recovery (CDR) circuit, comprising:
    a phase detector, sampling a data signal according to a first clock signal provided by the CDR circuit and obtaining a first plurality of sampling values, and providing a phase instruction signal according to the first plurality of sampling values;
    a first delayer, delaying the first clock signal so as to obtain a second clock signal;
    a frequency detector, coupled to the first delayer, sampling the data signal according to the second clock signal and obtaining a second plurality of sampling values, and providing a frequency instruction signal according to the second plurality of sampling values; and
    a logic circuit, coupled to the phase detector and the frequency detector, executing a logic computation with the phase instruction signal and the frequency instruction signal to generate a clock instruction signal;
    wherein when the phase instruction signal and the frequency instruction signal both present a frequency boosting status, the logic circuit makes the clock instruction signal to present the frequency boosting status; when the phase instruction signal presents a frequency reduction status while the frequency instruction signal presents the frequency boosting status, the logic circuit makes the clock instruction signal to present the frequency reduction status; and when the frequency instruction signal presents the frequency reduction status, the logic circuit makes the clock instruction signal to present a frequency maintaining status;
    wherein when the clock instruction signal presents the frequency boosting status, the CDR circuit boosts a frequency of the first clock signal; when the clock instruction signal presents the frequency reduction status, the CDR circuit reduces the frequency of the first clock signal; and when the clock instruction signal presents the frequency maintaining status, the CDR circuit maintains the frequency of the first clock signal unchanged.

2. The frequency detection circuit according to claim 1, wherein the phase detector consecutively samples the data signal according to the first clock signal for three times and obtaining a first sampling value, a second sampling value and a third sampling value in sequence, and provides the phase instruction signal according to a result of a comparison between the first sampling value, the second sampling value and the third sampling value.

3. The frequency detection circuit according to claim 2, wherein when the first sampling value is equal to the second sampling value, the phase detector makes the phase instruction signal to present the frequency reduction status, and when the second sampling value is equal to the third sampling value, the phase detector makes the phase instruction signal to present the frequency boosting status.

4. The frequency detection circuit according to claim 1, wherein the frequency detector consecutively samples the data signal according to the second clock signal for three times and obtaining a fourth sampling value, a fifth sampling value and a sixth sampling value in sequence, and provides the frequency instruction signal according to a result of a comparison between the fourth sampling value, the fifth sampling value and the sixth sampling value.

5. The frequency detection circuit according to claim 4, wherein when the fourth sampling value is equal to the fifth sampling value, the frequency detector makes the frequency instruction signal to present the frequency reduction status, and when the fifth sampling value is equal to the sixth sampling value, the frequency detector makes the frequency instruction signal to present the frequency boosting status.

6. The frequency detection circuit according to claim 1, wherein the phase instruction signal, the frequency instruction signal, and the clock instruction signal each includes a frequency boosting signal and a frequency reduction signal, and when the frequency boosting signal is asserted while the frequency reduction signal is de-asserted, the corresponding instruction signal presents the frequency boosting status; when the frequency boosting signal is de-asserted while the frequency reduction signal is asserted, the corresponding instruction signal presents the frequency reduction status; and when the frequency boosting signal and the frequency reduction signal are both de-asserted, the corresponding instruction signal presents the frequency maintaining status.

7. The frequency detection circuit according to claim 6, wherein the logic circuit comprises:
 an inverter, coupled to the phase detector, receiving the frequency reduction signal of the phase instruction signal;
 a NOR gate, coupled to the inverter and the frequency detector, receiving an output signal from the inverter and the frequency reduction signal of the frequency instruction signal, and outputting the frequency reduction signal of the clock instruction signal; and
 an AND gate, coupled to the phase detector and the frequency detector, receiving the frequency boosting signal of the phase instruction signal and the frequency boosting signal of the frequency instruction signal, and outputting the frequency boosting signal of the clock instruction signal.

8. The frequency detection circuit according to claim 7, wherein the logic circuit further comprises:
 a first D flip-flop, coupled to the NOR gate, triggered by the first clock signal and delaying the frequency reduction signal of the clock instruction signal; and
 a second D flip-flop, coupled to the AND gate, triggered by the first clock signal and delaying the frequency boosting signal of the clock instruction signal.

9. The frequency detection circuit according to claim 1, wherein the first delayer comprises a plurality of serially connected inverters for delaying the first clock signal.

10. The frequency detection circuit according to claim 1, wherein a delaying time of the first delayer is a ¼ period of the first clock signal, and the frequency detection circuit further comprises:
 a second delayer coupled between the frequency detector and the logic circuit, delaying the frequency instruction signal, wherein a delaying time of the second delayer is not equal to any integral multiple of the ¼ period of the first clock signal.

11. The frequency detection circuit according to claim 10, wherein the second delayer comprises a plurality of serially connected inverters for delaying the frequency instruction signal.

12. The frequency detection circuit according to claim 1, wherein a delaying time of the first delayer is not equal to any integral multiple of a ¼ period of the first clock signal.

13. The frequency detection circuit according to claim 1, wherein the CDR circuit further comprises:
 a voltage control oscillator (VCO), coupled with the phase detector and the first delayer, providing the first clock signal; and
 a charge pump, coupled between the logic circuit and the VCO, adjusting the frequency of the first clock signal according to the status of the clock instruction signal.

14. A detection method, for a clock data recovery (CDR) circuit, comprising:
 (a) sampling a data signal according to a first clock signal and obtaining a first plurality of sampling values, and providing a phase instruction signal according to the first plurality of sampling values;
 (b) delaying the first clock signal to obtain a second clock signal;
 (c) sampling the data signal according to the second clock signal and obtaining a second plurality of sampling values, and providing a frequency instruction signal according to the second plurality of sampling values;
 (d) executing a logic computation with the phase instruction signal and the frequency instruction signal to generate a clock instruction signal, wherein when the phase instruction signal and the frequency instruction signal both present a frequency boosting status, the clock instruction signal presents the frequency boosting status; when the phase instruction signal presents a frequency reduction status while the frequency instruction signal presents the frequency boosting status, the clock instruction signal presents the frequency reduction status; and when the frequency instruction signal presents the frequency reduction status, the clock instruction signal presents a frequency maintaining status;
 (e) boosting a frequency of the first clock signal when the clock instruction signal presents the frequency boosting status;
 (f) reducing the frequency of the first clock signal when the clock instruction signal presents the frequency reduction status; and
 (g) maintaining the frequency of the first clock signal unchanged when the clock instruction signal presents the frequency maintaining status.

15. The detection method according to claim 14, wherein a delaying time of the step (b) is a ¼ period of the first clock signal, and the detection method further comprises a step between the steps (c) and (d) as:
 delaying the frequency instruction signal, wherein the delaying time of the frequency instruction signal is not equal to any integral multiple of the ¼ period of the first clock signal.

16. The detection method according to claim 14, wherein a delaying time of the step (b) is not equal to any integral multiple of a ¼ period of the first clock signal.

17. A frequency detection circuit, for a clock data recovery (CDR) circuit, comprising:
 a phase detector, sampling a data signal according to a first clock signal provided by the CDR circuit and obtaining a first plurality of sampling values, and providing a phase instruction signal according to the first plurality of sampling values;
 a first delayer, delaying the first clock signal so as to obtain a second clock signal, wherein a delaying time of the first delayer is a ¼ period of the first clock signal;
 a frequency detector, coupled to the first delayer, sampling the data signal according to the second clock signal and obtaining a second plurality of sampling values, and providing a frequency instruction signal according to the second plurality of sampling values;
 a second delayer coupled to the frequency detector, delaying the frequency instruction signal, wherein a delaying time of the second delayer is not equal to any integral multiple of the ¼ period of the first clock signal; and a logic circuit, coupled to the phase detector and the second delayer, executing a logic computation with the phase instruction signal and the delayed frequency instruction signal to generate a clock instruction signal, wherein the CDR circuit adjusts a frequency of the first clock signal according to a status of the clock instruction signal.

18. A frequency detection circuit, for a clock data recovery (CDR) circuit, comprising:

a phase detector, sampling a data signal according to a first clock signal provided by the CDR circuit and obtaining a first plurality of sampling values, and providing a phase instruction signal according to the first plurality of sampling values;

a first delayer, delaying the first clock signal so as to obtain a second clock signal, wherein a delaying time of the first delayer is not equal to any integral multiple of a ¼ period of the first clock signal;

a frequency detector, coupled to the first delayer, sampling the data signal according to the second clock signal and obtaining a second plurality of sampling values, and providing a frequency instruction signal according to the second plurality of sampling values; and a logic circuit, coupled to the phase detector and the frequency detector, executing a logic computation with the phase instruction signal and the frequency instruction signal to generate a clock instruction signal, wherein the CDR circuit adjusts a frequency of the first clock signal according to a status of the clock instruction signal.

19. A detection method, for a clock data recovery (CDR) circuit, comprising:

(a) sampling a data signal according to a first clock signal and obtaining a first plurality of sampling values, and providing a phase instruction signal according to the first plurality of sampling values;

(b) delaying the first clock signal to obtain a second clock signal, wherein a delaying time of the first clock signal is a ¼ period of the first clock signal;

(c) sampling the data signal according to the second clock signal and obtaining a second plurality of sampling values, and providing a frequency instruction signal according to the second plurality of sampling values;

(d) delaying the frequency instruction signal, wherein the delaying time of the frequency instruction signal is not equal to any integral multiple of the ¼ period of the first clock signal;

(e) executing a logic computation with the phase instruction signal and the delayed frequency instruction signal to generate a clock instruction signal; and (f) adjusting a frequency of the first clock signal according to a status of the clock instruction signal.

20. A detection method, for a clock data recovery (CDR) circuit, comprising:

(a) sampling a data signal according to a first clock signal and obtaining a first plurality of sampling values, and providing a phase instruction signal according to the first plurality of sampling values;

(b) delaying the first clock signal to obtain a second clock signal, wherein a delaying time of the first clock signal is not equal to any integral multiple of a ¼ period of the first clock signal;

(c) sampling the data signal according to the second clock signal and obtaining a second plurality of sampling values, and providing a frequency instruction signal according to the second plurality of sampling values;

(d) executing a logic computation with the phase instruction signal and the frequency instruction signal to generate a clock instruction signal; and (e) adjusting a frequency of the first clock signal according to a status of the clock instruction signal.

* * * * *